July 7, 1970 J. N. LIND 3,519,962

MICROWAVE TRANSMISSION LINE

Filed March 11, 1968

*INVENTOR.*
JAMES N. LIND

*BY* Howard A. Silber

ATTORNEY 3,519,962

MICROWAVE TRANSMISSION LINE

James N. Lind, Costa Mesa, Calif., assignor to North American Rockwell Corporation Filed Mar. 11, 1968, Ser. No. 711,934
Int. Cl. H01p *3/08;* H05k *1/14;* H04b *15/00*
U.S. Cl. 333—12 12 Claims

ABSTRACT OF THE DISCLOSURE

A microwave transmission line adapted for incorporation in an integrated circuit and fabricated on a dielectric substrate having a ground plane on its lower surface. The transmission line comprises an elongate metal strip disposed stop the substrate. The longitudinal edges of the metal strip abut respectively against first and second elongate, substantially L-shaped dielectric branches which operate as quarter-wave traps preventing undesired propagation away from the line into the substrate.

BACKGROUND OF THE INVENTION

Field of the invention

The present invention relates to a microwave line. More particularly, the invention relates to transmission line adopted for incorporation in a microwave integrated circuit and comprising an elongate metal strip disposed on a dielectric substrate, a pair of dielectric-filled quarter-wave branches defining the longitudinal edges of the strip.

Description of the prior art

Recent advances in microelectronics point to the possibility that completely integrated solid state microwave circuits can be fabricated in the near future. Improvements in materials technology, including the availability of very high mobility semiconductors such as gallium arsenide, and improvements in epitaxial techniques, permitting device grade semiconductor materials to be grown on electrically insulating substrates, lend themselves to microwave applications. Devices such as the varactor diode and the Gunn effect oscillator facilitate the generation, amplification and detection of microwave signals using solid state components. Further, a technology now is developing for interconnecting such devices and elements by means of microstrips to form completely integrated microwave circuits.

Microwave interconnection microstrips of the prior art comprises a simple metallic band deposited directly onto an insulating substrate, which substrate also may contain other microelectronic components. Typically, a metal ground plane is provided on the opposite surface of the substrate. Microwave energy is conducted down the microstrip in the TEM mode, a mode in which both the electric and magnetic field components in the direction of propagation of the signal (i.e., along the longitudinal direction of the microstrip) are zero.

Such prior art microstrips, while easy to fabricate using technique consistent with integrated circuit processing, suffer several disadvantages particularly at high frequencies. In particular, power loss is experienced by radiation and by undesired propagation of the signal away from the microstrip within the dielectric substrate. The latter problem is perticularly acute since it limits the degree of electrical isolation whch can be acheved between circuit elements on the same substrate. As a result, adjacent components must be spaced relatively far apart ot achieve the electrical isolation requisite to proper circuit operation, thereby limiting the extent to which the circuit can be miniaturized.

The problem of power loss from prior art microwave microstrips becomes particularly acute as the frequency of operation increases. At higher microwave frequencies, the quarter-wavelength of the signal propagated by the microstrip may approach the thickness dimension $h$ of the dielectric substrate. When this condition is reached, microwave energy is propagated away from the microstrip within the substrate. The substrate functions as a dielectric waveguide, the metal ground plane acting as the bottom waveguide wall, the dielectric-air interface constituting the upper waveguide wall, the difference in dielectric constant between the substrate and air being sufficient to bind the wave.

An estimate of the frequency above which significant power loss is experienced from a prior art microstrip can be obtained by noting that the effective wavelength $\lambda_e$ of the signal being propagated in the substrate is given by $$\lambda_e = \frac{\lambda_o}{\sqrt{\epsilon}} \tag{1}$$

where $\epsilon$ is the relative dielectric constant of the substrate and $\lambda_o$ is the free space wavelength of the signal. The loss problem becomes acute when $h$ (the substrate thickness) approaches $$\frac{\lambda_e}{4}$$

that is, $h$ approaches $$\frac{\lambda_o}{4\sqrt{\epsilon}}$$

At a frequency of about 10 gHz. (approximately the center of the X band) $\lambda_o$ is about 3 centimeters. If the dielectric substrate used for the integrated circuit has a relative dielectric constant $\epsilon$ of approximately 9, significant power will be lost when $$= \frac{\lambda_e}{4} = \frac{\lambda_o}{4\sqrt{\epsilon}} = \frac{3\text{ cm.}}{4\sqrt{9}} = .25\text{ cm.} \cong .1\text{ inch}$$

Thus at 10 gHz. it is desirable that the substrate be significantly thinner than .1 inch to minimize loss by propagation within the substrate. Since it is possible to provide substrate materials having thicknesses of about .01 inch using conventional grinding and polishing techniques, power loss at X band can be maintained at a minimum with conventional microstrips.

When operating frequencies significantly higher than 10 gHz. are used, the problem becomes acute. For example, at a frequency of 100 gHz. (within the F band) the effective quarter wavelength $$\frac{\lambda_e}{4}$$

in a dielectric substrate having a relative dielectric constant $\epsilon=9$ is approximately .01 inch. Since significant power loss is experienced when $h$ approaches $$\frac{\lambda_e}{4}$$

the dielectric substrate preferably should be considerably thinner than .01 inch. However, it is extremely difficult to grind dielectric substrate materials such as sapphire to thicknesses of less than about .01 inch using techniques which can be incorporated readily in commercial manufacturing operations.

Thus it is apparent that the microwave microstrips of the prior art are not well suited for integrated circuit application at very high microwave frequencies, particularly where high component density is desired. To eliminate this shortcoming, the present invention sets forth a microwave integrated circuit transmission line which can be constructed using conventional microelectronic fabrication techniques, and which achieves maximum confinement of the microwave signal being propagated by the line. Use of the inventive transmission line permits significant reduction in radiation and propagation losses at high microwave frequencies compared with prior art microstrips. Thus utilization of the invention facilitate fabrication of practical microwave integrated circuits of high densty on substrates having thicknesses which can be obtained with conventional grinding and polishing techniques.

SUMMARY OF THE INVENTION

In accordance with the present invention, there is set forth a microwave transmission line adapted for incorporation in a microwave integrated circuit. The transmission line comprises a dielectric substrate having on its lower surface a metallic ground plane and on its top surface an elongate metal strip. The width of the strip corresponds to the effective wavelength in the dielectric substrate of the lowest frequency of operation of the transmission line. Adajacent each longitudinal edges of the metal strip is disposed a dielectric filled, substantially L-shaped quarter-wave branch. The branches act as quarter-wave traps, presenting a high impedance to a signal attempting to propagate within the dielectric substrate away from the transmission line.

The inventive microwave transmission line may be fabricated using techniques well known in the microelectronic art, and compatible with known integrated circuit fabrication techniques. Thus, the metal strip and the layers defining the dielectric filled branches may be provided by vacuum evaporation followed by appropriate masking and etching operations. Deposition of the dielectric filling the L-shaped branch sections may be accomplished by sputtering.

Thus, it is an object of the present invention to provide an improved microwave transmission line.

Another object of the present invention is to provide a microwave "guideline" which can be incoroprated in a microwave integrated circuit.

It is another object of the present invention to provide an integrated circuit microwave transmission line having minimal power loss.

Yet another object of the present invention is to provide a microwave guideline capable of being fabricated by standard microelectronic processing techniques.

A further object of the present invention is to provide an integrated circuit transmission line incorporating series high impedance branches.

Yet a further object of the present invention is to provide a microwave guideline having dielectric-filled quarter wave branches adjacent its longitudinal edges.

Still a further object of the present invention is to provide a device for restraining energy to within a desired region of a dielectric substrate.

BRIEF DESCRIPTION OF THE DRAWINGS

Still other objects, features and attendant advantages of the present invention will become apparent to those skilled in the art from a reading of the following detailed description of the preferred embodiment constructed in accordane therewith, taken in conjunction with the accompanying drawings wherein like numerals designate like parts in the several figures and wherein.

DESCRIPTION OF THE PREFERRED EMBODIMENT

Figure 1:
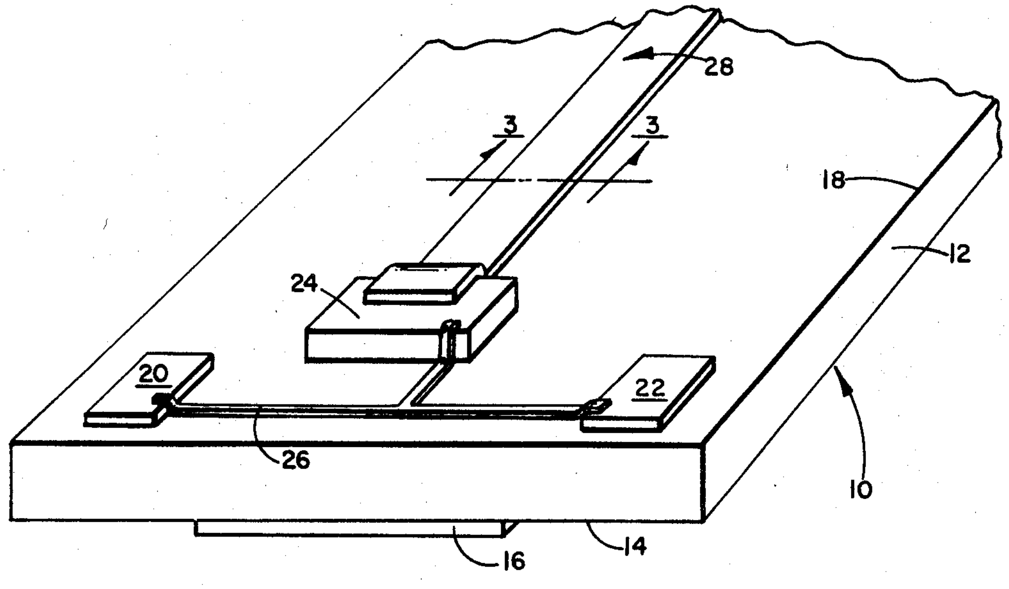
FIG. 1 is a greatly enlarged, fragmentary perspective view of a typical microwave integrated circuit utilizing the inventive microwave transmission line.

Referring now to the drawings and particularly to FIG. 1 thereof, there is shown a typical microwave integrated circuit 10 such as may be fabricated on an electrically insulating substrate 12. Although the invention is not so limited, substrate 12 may comprise an electrically insulating monocrystalline material such as sapphire, spinel, BeO, MgO, or the like on which semiconductor materials may be epitaxially deposited. Disposed on the bottom surface 14 of substrate 12, and covering a substantial area thereof, is a metallic ground plane 16. Atop the upper surface 18 of substrate 12 are provided various islands 20, 22, and 24 each of semiconductor material such as silicon, germanium, gallium arsenide, gallium phosphide or the like, which islands may be formed by epitaxial deposition of the semiconductor onto substrate 12. Islands 20 and 22 may include various active or passive electronic components fabricated by techniques well known to those skilled in the microelectronic art.

Electrical interconnections between the various islands are provided by appropriate metallic conductors 26 which may be sputtered or otherwise deposited onto upper surface 18 of substrate 12. (Conductors 26 are not designed to transmit microwave signals, but rather are of the type well known in the microelectronic art for conduction of DC and sub-microwave digital or other signals.)

In the embodiment shown in FIG. 1, island 24 may comprise a microwave generating device such as a Gunn effect oscillator fabricated e.g., in gallium arsenide. A microwave signal generated by device 24 may be propagated to a utilization device (not shown) by means of the inventive microwave transmission line 28 disposed atop dielectric substrate 12, and fabricated in a manner described in detail hereinbelow using standard microelectronic techniques. The utilization device may comprise an antenna, a solid state microwave amplifier, etc., and may be located either on substrate 12, or external thereof.

Figure 2:
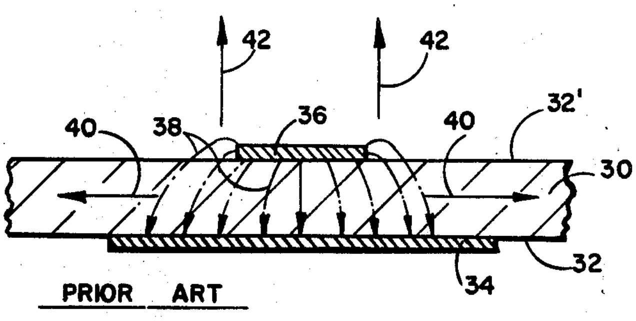
PRIOR ART FIG. 2
FIG. 2 is a greatly enlarged fragmentary sectional view of a microwave microstrip in accordance with the prior art.

The unique features of inventive waveguide 28 may be appreciated by comparison with a typical prior art microstrip such as that shown in FIG. 2. Referring to FIG. 2, an electrically insulating substrate 30 is provided on its lower surface 32 with a ground plane 34. Disposed atop the upper surface 32' of substrate 30 is a narrow microstrip 36 comprising a single metal strip having the width typically on the order of one wavelength (in dielectric 30) of the signal being transmitted.

Energy generally is propagated along prior art microstrip 36 in the TEM mode, in which mode the components of the electric and magnetic field in a direction longitudinal of line 36 both are zero. As shown in FIG. 2, arrows 38 represent an electric field pattern which may be present during propagation in the TEM mode. When the frequency of operation is sufficiently high so that the thickness of substrate 12 approaches a quarter wavelength (in the dielectric material) of the signal being propagated, power loss is experienced from microstrip 36 by two mechanisms. First, dielectric substrate 30 itself acts as a waveguide, the lower and upper walls respectively comprising the interface 32 with ground plane 34, and the air/dielectric interface 32'. Arrows 40 represent energy flow from the microstrip 36 resulting from such propagation into the substrate. In addition, electric field discontinuities adjacent microstrip 36 result in radiation into space, as represented by arrows 42 in FIG. 2.

The inventive microwave transmission line 28 (shown generally in FIG. 1 and in detail in the sectional view of FIG. 3) significantly reduces such energy losses associated with prior art microstrips.

Figure 3:
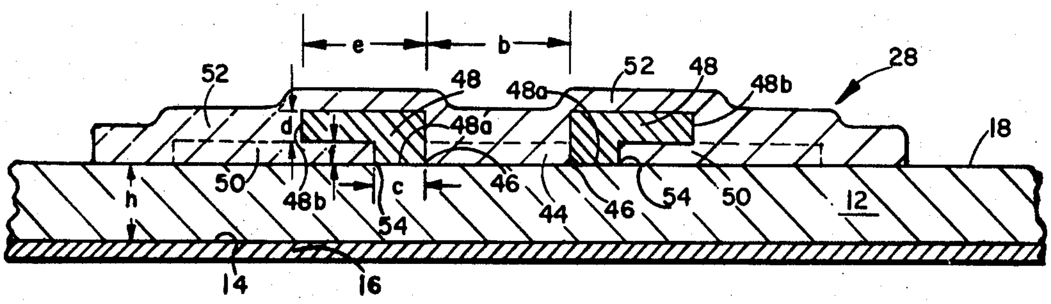
FIG. 3 is a greatly enlarged fragmentary sectional view of the inventive microwave transmission line, as seen generally along the line 3—3 of FIG. 1. The dielectric-filled high impedance branches are evident in this sectional view.

Referring now to FIG. 3, inventive waveguide 28 comprices a metallic strip 44 having a width *b*. Preferably, width *b* is selected so that at the frequency of operation an electric field voltage maxima will appear between the edges 46 of microstrip 44 and ground plane 16. Thus, for example, the dimension $b$ may be selected to correspond to one-half the effective wavelength $\lambda_e$ (in dielectric substrate 12) of the signal being propagated.

Disposed along each longitudinal edge 45 of strip 44 is a substantially L-shaped high impedance branch 48, branches 48 being commensurate in longitudinal extent with the length of strip 44. Each branch 48 is dielectric filled, typically with a material such as silicon oxide, magnesium oxide, aluminum oxide, or the like which can be deposited by techniques well known in the microelectronic art. The dimension $c$ across opening 48a of each branch 48 preferably is small compared with a quarter wavelength at the operational frequency, but large enough so that the dielectric material filling branch 48 will not break down under the electric field level present. The thickness $d$ of each L-shaped branch 48 may be somewhat smaller than the dimension $c$, since the electric field level within the branch gets progressively lower with increasing distance from the opening 48a, reaching a minima at the terminal end 48b.

The effective depth $e+f$ of branch 48 is selected to correspond to one quarter of the effective wavelength $\lambda_e$ (in the dielectric medium filling the branch) at the operational frequency. A pair of planar metalized regions 50 serve to define the width of opening 48a, and are electrically interconnected to strip 44 by means of a metallized layer 52. In a preferred embodiment, regions 44, 50 and 52 comprise the same metal, typically gold, aluminum, tungsten or the like.

In effect, branches 48 comprise quarter-wave traps defining the longitudinal edges of metal strip 44. Such quarter-wave traps present a high impedance to a signal propagating in a direction transverse to the direction of strip 44.

In operation, a signal introduced into inventive transmission line 28 travels along strip 44 in a waveguide mode, with a voltage maximum existing between edges 46 and ground plane 16. An electric field maximum also exists between edges 54 and 46, that is, across openings 48a of branch sections 48. Energy is induced into quarter wave branch sections 48, with voltage minima at terminal ends 48b. Each section 48 appears as a series high impedance branch (i.e., an open circuit) to a signal attempting to propagate within substrate 12 perpendicular to the longitudinal direction of strip 44. As a result, quarter wave branches 48 effectively define the "side walls" of a waveguide, the top of which is defined by strip 44 and the bottom by ground plane 16. Substantially all of the energy of the propagated wave is restricted to within this effective waveguide region, thereby significantly reducing undesired propagation away from transmission line 28 within dielectric substrate 12.

The reduced electric field distortion at the edges 46 of strip 44 (resulting from waveguide mode propagation), as compared with the distortion present at the edges of microstrip 36 in the prior art microstrip of FIG. 2, results in a significant reduction in radiation from the inventive integrated circuit microwave transmission line.

The minimum frequency of operation of a transmission line operated in a waveguide mode is determined by the horizontal dimension $b$. For propagation in the lowest order mode, length $b$ will correspond to one effective wavelength in substrate 12; this permits calculation of the cutoff frequency $\lambda_c$ of the inventive transmission line 28. By way of illustration, the following dimensions (see Table I) are provided for a microwave transmission line in accordance with the present invention and capable of operation in the F band. In the example, substrate 12 comprises sapphire having a dielectric constant $\epsilon$ of 10.5 while branches 48 are filled with $SiO_2$ dielectric material having a dielectric constant of 3.6.

TABLE I

Dimension (in inches except as noted):

$h=0.003$ $b=0.048$ $c=0.004$ $d=0.001$ $e=0.0155$ $f=2$ microns

For a transmission line 28 having the dimensions given in Table I, the cutoff wavelength $\lambda_c$ is given by $$\lambda_c=\lambda_o \text{ (at lowest frequency of operation)}=\lambda_e\sqrt{\epsilon}$$
$$=(0.048 \text{ inch})\ (2.54 \text{ cm./inch})\sqrt{10.5}\cong 0.4 \text{ cm.}$$

which corresponds to a cutoff frequency of approximately 75 gHz. Signals below this cutoff frequency will not be propagated by transmission line 28. The frequency $f$ at which branches 48 have an effective depth of one-quarter wavelength may be calculated as follows:

$$f=\frac{c}{\lambda_o}=\frac{c}{\lambda_e\sqrt{\epsilon}}=\frac{e}{4(e+f)\sqrt{\epsilon}}$$
$$=\frac{3\times 10^{10} \text{ cm./sec.}}{4(0.0155 \text{ inch})(2.54 \text{ cm./inch})\sqrt{3.6}}=100 \text{ gHz.}$$

where $c$ is the speed of light in a vacuum, and $(e+f)$ is the depth of branch 48 (see FIG. 3). As noted earlier, 100 gHz. is within the F band.

Fabrication of the inventive microwave transmission line 28 may be accomplished using techniques well known in the microelectronic art. For example, the following process may be employed. Initially, dielectric substrate 12 is ground and polished to an appropriate thickness, using conventional techniques. Then, gold, aluminum or other metal is vacuum evaporated onto upper surface 18 of substrate 12 to form a film of thickness $f$. This deposition step may take place through an appropriate mask to form regions 44 and 50 directly. Alternatively, the deposited metal film may be coated with an appropriate photo-resist. The photo-resist then is exposed through a mask having opaque areas corresponding to regions 48a and developed. An appropriate etchant then is used to etch away the deposited metal film beneath the unexposed areas of the photo-resist, thereby forming openings 48a. The residual photo-resist then is stripped away.

Next, an appropriate dielectric material then is deposited into openings 48a, and to a thickness $d$ over the metal film regions 44 and 50. Susequently, a second photo-resist and etch process is used to define the edges 48b of sections 48 and also to etch away undesired dielectric material from the region immediately atop metal section 44. Finally, another sputtering or evaporation step is used to deposit metal region 52, this region insuring electrical contact between metal regions 50 and 44. Although metal layer 52 is illustrated in FIG. 3 as extending beyond the ends of metal sections 50, this is not necessary so long as the requisite electrical contact is maintained between regions 44 and 50.

While the foregoing illustrative embodiment has been described as utilizing a substrate 12 comprising a monocrystalline electrically insulating material on which a semiconductor can be grown epitaxially, the invention is not so limited. Thus, substrate 12 may comprise any electrically insulating material, for example, a semiconductor doped so as to have a high electrical resistance. With such a semiconductor, other substrate regions could be appropriately doped so as to form active and passive circuit elements, thereby forming a monolithic microwave integrated circuit incorporating the inventive transmission line.

Similarly, while several illustrative examples of dielectric material for L-shaped branch sections 48 are set forth hereinabove, the invention is not so limited. Branches 48 may comprise any appropriate dielectric material. Of course, if transmission line 28 is incorporated in an integrated circuit, the dielectric material utilized should be compatible with the materials and processes used to form the associated circuit. Moreover, while branches 48 are shown as substantially L-shaped in cross-section, this is not a necessity. Branches 48 could be rectangular in cross-section and extend perpendicular to surfaces 18. Of course, such a configuration is not as conveniently incorporated into a microelectronic circuit as is the configuration of FIG. 3.

Throughout the discussion hereinabove, borderwave branches 48 have been utilized to define the longitudinal edges of an effective waveguide within dielectric substrate 12. Similarly constructed quarter-wave traps may be used in other than a parallel elongate configuration to restrict microwave energy to a portion of a dielectric substrate. Thus, for example, a rectangularly, or a circularly configured L-shaped dielectric quarter-wave trap may be used to define a correspondingly shaped closed resonant region within a dielectric substrate. Microwave energy introduced into the region would be substantially confined therein. Such a resonant cavity may find application in microwave parametric amplifiers and the like.

Although the invention has been described and illustrated in detail, it is to be understood that the same is by way of illustration and example only, and is not to be taken by way of limitation, the spirit and scope of this invention being limited only by the terms of the appended claims.

I claim:

1. In an integrated microwave microstrip of the type comprising an elongate metal strip disposed on an electrically insulating substrate, that improvement comprising: a pair of elongate dielectric-filled branches disposed on said substrate adjacent respective longitudinal edges of said metal strip, the depth of said branches corresponding to one-quarter of the effective wavelength in said dielectric of a signal to be propagated by said microstrip.

2. A microwave transmission line comprising:
a dielectric substrate,
an elongate metal strip disposed atop said substrate, and
first and second dielectric-filled quater-wave branches disposed atop said substrate adjacent respective first and second longitudinal edges of said metal strip.

3. The transmission line defined in claim 2 further comprising: a metallic ground plane on the lower surface of said dielectric substrate opposite said metal strip.

4. The transmission line defined in claim 2 wherein the longitudinal extent of said branches corresponds to the length of said metal strip.

5. The transmission line defined in claim 3 wherein said branches are substantially L-haped in cross-section.

6. The transmission line defined in claim 5 wherein the width of said metal strip corresponds to the effective wavelength in said dielectric substrate of the lowest frequency of operation of said transmission line.

7. The transmission line defined in claim 6 wherein the dielectric material filling said branches is selected from the class consisting of silicon oxide, magnesium oxide, beryllium oxide, calcium fluoride, and alumina.

8. The transmission line defined in claim 7 wherein said substrate comprises a monocrystalline, electrically insulating material.

9. In combination:
a microwave transmission line as defined in claim 2, and
solid state means, disposed on said dielectric substrate, for generating a microwave signal and for coupling said signal into said transmission line for propagation thereby.

10. The combination defined in claim 9 further comprising: utilization means, disposed on said substrate and coupled to said transmission line, for utilizing said signal propagated by said line.

11. A microwave transmission line adapted for incorporation in a microwave integrated circuit fabricated on a dielectric substrate and having a metallic ground plane on a lower surface of said substrate, said transmission line comprising:
an elongate metal strip disposed on the upper surface of said substrate, the width of said strip corresponding to the effective wavelength in said substrate of the lowest frequency of operation of said transmission line,
first and second elongate metal films disposed on said upper surface in parallel spaced apart relation with respective first and second longitudinal edges of said metal strip, the spacing between said films and said strip being substantially less than one-quarter of the effective wavelength of a signal to be propagated by said transmission line,
first and second elongate regions of dielectric material, said dielectric material filling the spaces atop said substrate between said strip and said films, said regions extending atop said films away from said strip for a distance substantially equal to one-quarter of the effective wavelength in said dielectric material of the said signal to be propagated, the longitudinal extent of said regions corresponding to the length of said strip, and
a layer of metal completely covering said regions, said layer electrically connecting said films and said strip.

12. Means for restraining energy to within a region only of a dielectric substrate, said substrate having a metallic ground plane on its lower surface, said means comprising:
a metallic film on a portion of the upper surface of said substrate, said portion covering said region, and
a dielectric-filled quarter-wave branch disposed on said upper surface surrounding said film and immediately adjacent the edges thereof.

References Cited

UNITED STATES PATENTS

| | | | |
|---|---|---|---|
| 2,419,049 | 4/1947 | Alpert | 333—98 |
| 2,721,312 | 10/1955 | Grieg et al. | 333—84 |
| 2,754,484 | 7/1956 | Adams | 333—12 X |
| 3,391,454 | 7/1968 | Reimann et al. | 174—68.5 X |

OTHER REFERENCES

IBM, Method for Printed Circuit Printing, IBM Tech. Disclosure Bulletin, vol. 10, No. 7, 12–67.

HERMAN KARL SAALBACH, Primary Examiner

W. H. PUNTER, Assistant Examiner

U.S. Cl. X.R.

174—68.5; 333—84, 97